United States Patent
Johnston et al.

(10) Patent No.: US 10,788,762 B2
(45) Date of Patent: Sep. 29, 2020

(54) DYNAMIC COOLING CONTROL FOR THERMAL STABILIZATION FOR LITHOGRAPHY SYSTEM

(71) Applicant: Applied Materials, Inc., Santa Clara, CA (US)

(72) Inventors: Benjamin M. Johnston, Los Gatos, CA (US); David Michael Corriveau, Sacramento, CA (US); Cheuk Ming Lee, Castro Valley, CA (US); Jae Myung Yoo, San Jose, CA (US); WeiMin Tao, Palo Alto, CA (US); Antoine P. Manens, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/284,516

(22) Filed: Feb. 25, 2019

(65) Prior Publication Data
US 2020/0272063 A1   Aug. 27, 2020

(51) Int. Cl.
*G03F 7/20* (2006.01)

(52) U.S. Cl.
CPC ...... *G03F 7/70858* (2013.01); *G03F 7/70291* (2013.01); *G03F 7/70391* (2013.01);
(Continued)

(58) Field of Classification Search
CPC ............. G03F 7/70291; G03F 7/70391; G03F 7/70425; G03F 7/70533; G03F 7/70725;
(Continued)

(56) References Cited

U.S. PATENT DOCUMENTS

2001/0055102 A1* 12/2001 Emoto ............... G03F 7/70525
355/53
2006/0017331 A1* 1/2006 Desailly ............. H02K 41/031
310/12.29
(Continued)

FOREIGN PATENT DOCUMENTS

| JP | 2001-290543 A | 10/2001 |
| JP | 4651938 B2 | 3/2011 |
| JP | 2012-118159 A | 6/2012 |

OTHER PUBLICATIONS

PCT Notification of Transmittal of the International Search Report and the Written Opinion of the International Searching Authority for International Application No. PCT/US2020/014821; dated May 22, 2020.

*Primary Examiner* — Colin W Kreutzer
(74) *Attorney, Agent, or Firm* — Patterson + Sheridan LLP

(57) ABSTRACT

Embodiments described herein provide a system, a software application, and methods of a lithography process that provide at least one of the ability to decrease the stabilization time and write an exposure pattern into a photoresist on a substrate compensating for the change in the total pitch over a stabilization time. One embodiment of the system includes a slab, a stage disposed over the slab, a pair of supports disposed on the slab, a processing apparatus, and a chiller system. The pair of supports support a pair of tracks and the stage is configured to move along the pair of tracks. The processing apparatus has an apparatus support coupled to the slab and a processing unit supported by the apparatus support. The processing unit has a plurality of image projection systems. The chiller system has at least one fluid channel disposed in each track of the pair of tracks.

18 Claims, 11 Drawing Sheets

(52) U.S. Cl.
CPC ...... *G03F 7/70425* (2013.01); *G03F 7/70533* (2013.01); *G03F 7/70725* (2013.01); *G03F 7/70875* (2013.01); *G03F 7/70891* (2013.01)

(58) Field of Classification Search
CPC ............. G03F 7/70858; G03F 7/70875; G03F 7/70891
USPC ..................................................... 355/30, 77
See application file for complete search history.

(56) References Cited

U.S. PATENT DOCUMENTS

| | | | |
|---|---|---|---|
| 2006/0033892 A1* | 2/2006 | Cadee | G03F 7/70341 355/30 |
| 2007/0076180 A1 | 4/2007 | Tinnemans et al. | |
| 2008/0023656 A1 | 1/2008 | Quach et al. | |
| 2016/0282849 A1* | 9/2016 | Hollerbach | G03F 7/70358 |
| 2018/0024436 A1* | 1/2018 | Laidig | G03F 7/70258 355/67 |

* cited by examiner

DYNAMIC COOLING CONTROL FOR THERMAL STABILIZATION FOR LITHOGRAPHY SYSTEM

BACKGROUND

Field

Embodiments of the present disclosure generally relate to lithography systems. More particularly, embodiments of the present disclosure relate to digital lithography systems that compensate for temperature change during operation.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

During operation of a lithography system, movements of the stage results in the dissipation of heat over a period of time throughout the system. Over the period of time, the dissipation of heat throughout the system increases temperatures of components of the system. As temperatures of components of the system increase over the period of time, i.e, the stabilization time, a total pitch of the substrate changes until a stabilization temperature is maintained. At the stabilization temperature, the total pitch is constant. Operation of the system to perform one or more process recipes during the stabilization time, without the system at the stabilization temperature, may result in overlay error. Therefore, idle process recipes are performed until the stabilization temperature is reached. The idle process recipes decrease throughput.

Accordingly, what is needed in the art is a system, a software application, and methods of a lithography process to increase throughput.

SUMMARY

In one embodiment, a system is provided. The system includes a slab, a moveable stage disposed over the slab, a pair of supports disposed on the slab, a processing apparatus, and a chiller system. The stage is configured to support a substrate. The pair of supports support a pair of tracks and the stage is configured to move along the pair of tracks. The processing apparatus has an apparatus support coupled to the slab and a processing unit supported by the apparatus support. The apparatus support has an opening for the stage to pass thereunder and the processing unit has a plurality of image projection systems. The chiller system has at least one fluid channel disposed in each track of the pair of tracks.

In another embodiment, a system is provided. The system includes a slab, a moveable stage disposed over the slab, a pair of supports disposed on the slab, a processing apparatus, and one or more temperature detectors located at one or more of the slab, an apparatus support, and at least one track of a pair of tracks. The pair of supports support the pair of tracks and the stage is configured to move along the pair of tracks. The processing apparatus has the apparatus support coupled to the slab and a processing unit supported by the apparatus support. The apparatus support has an opening for the stage to pass thereunder and the processing unit has a plurality of image projection systems. The processing unit is coupled to a controller configured to provide a pattern data to processing unit. The pattern data received by processing unit corresponds to a sequence of one or more process recipes in which each of the image projection systems expose a photoresist disposed on the substrate to an exposure pattern. The temperature detectors are coupled to the controller, and the temperature detectors are configured to provide measured temperatures during exposure of the photoresist to the controller. Based on the measured temperatures, the controller is configured to generate a compensated pattern data and provide the compensated pattern data to the processing unit.

In yet another embodiment, a system is provided. The system includes a slab, a moveable stage disposed over the slab, a pair of supports disposed on the slab, a processing apparatus, a chiller system, and one or more temperature detectors located at one or more of the slab, an apparatus support, and at least one track of a pair of tracks. The pair of supports support the pair of tracks and the stage is configured to move along the pair of tracks. The processing apparatus has the apparatus support coupled to the slab and a processing unit supported by the apparatus support. The apparatus support has an opening for the stage to pass thereunder and the processing unit has a plurality of image projection systems. The processing unit is coupled to a controller configured to provide a pattern data to processing unit. The pattern data received by processing unit corresponds to a sequence of one or more process recipes in which each of the image projection systems expose a photoresist disposed on the substrate to an exposure pattern. The chiller system has at least one fluid channel disposed in each track of the pair of tracks. The temperature detectors are coupled to the controller, and the temperature detectors are configured to provide measured temperatures during exposure of the photoresist to the controller. Based on the measured temperatures, the controller is configured to generate a compensated pattern data and provide the compensated pattern data to the processing unit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a system, a software application, and methods of a lithography process that provide at least one of the ability to decrease the stabilization time and the ability write an exposure pattern into a photoresist on a substrate compensating for the change in the total pitch over a stabilization time. One embodiment of the system includes a slab, a moveable stage disposed over the slab, a pair of supports disposed on the slab, a processing apparatus, and a chiller system. The stage is configured to support a substrate. The pair of supports support a pair of tracks and the stage is configured to move along the pair of tracks. The processing apparatus has an apparatus support coupled to the slab and a processing unit supported by the apparatus support. The apparatus support has an opening for the stage to pass thereunder and the processing unit has a plurality of image projection systems. The chiller system has at least one fluid channel disposed in each track of the pair of tracks.

Figure 1:
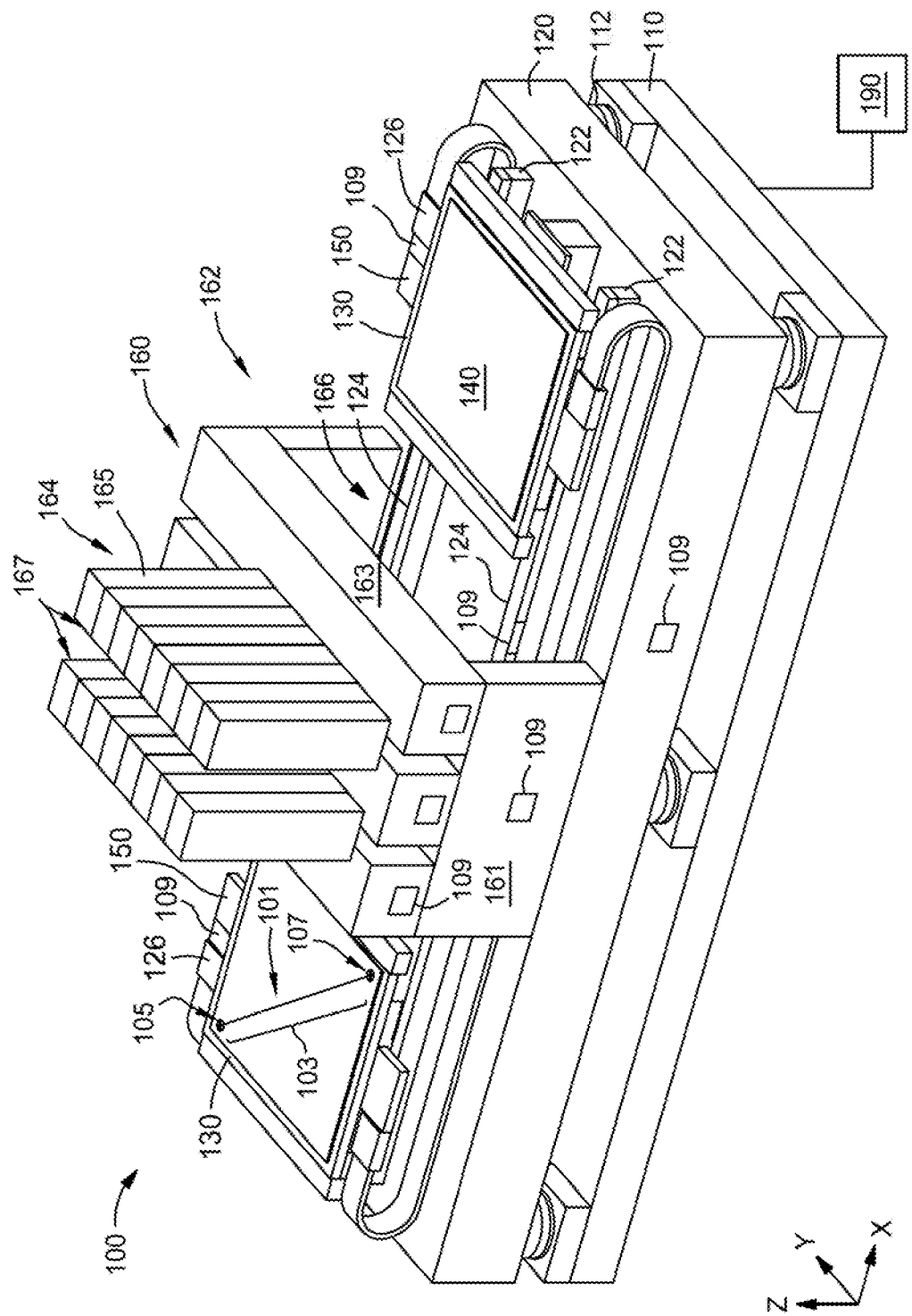
FIG. 1 is a perspective view of a system according to an embodiment.

FIG. 1 is a perspective view of a system 100, such as a digital lithography system, that may benefit from embodiments described herein. The system 100 includes a base frame 110, a slab 120, one or more stages 130, and a processing apparatus 160. The base frame 110 may rest on the floor of a fabrication facility and supports the slab 120. Passive air isolators 112 are positioned between the base frame 110 and the slab 120. The slab 120 may be a monolithic piece of granite, and the one or more stages 130 may be disposed on the slab 120. A substrate 140 may be supported by each of the one or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of quartz and be used as part of a flat panel display. In other embodiments, the substrate 140 may be made of other materials. In embodiments described herein, which can be combined with other embodiments described herein, the substrate includes glass, such as Alkaline Earth Boro-Aluminosilicate. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 further includes a pair of supports 122 and a pair of tracks 124. The pair of supports 122 is disposed on the slab 120, and, in one embodiment, which can be combined with other embodiments described herein, the slab 120 and the pair of supports 122 may be a single piece of material. In embodiments described herein, which can be combined with other embodiments described herein, the pair of tracks 124 may be supported by the pair of the supports 122, and the two or more stages 130 may move along the tracks 124 in the X-direction. In one embodiment, which can be combined with other embodiments described herein, the pair of tracks 124 is a pair of magnetic channels 301 (shown in FIG. 3). As shown, each track of the pair of tracks 124 is linear. In other embodiments, which can be combined with other embodiments described herein, each track of the pair of tracks 124 is linear. In one embodiment, which can be combined with other embodiments described herein, an encoder 126 is respectively co-located with each stage 130 in order to provide location information to a controller 190, described in further detail herein. Each of the one or more stages 130 may also move in the Y-direction by moving along a track 150 for processing and/or indexing the substrate 140. In embodiments described herein, which can be combined with other embodiments described herein, each stage 130 includes a plurality of air bearings (not shown) for lifting the stage 130. In embodiments described herein, which can be combined with other embodiments described herein, each stage 130 includes an electric motor (not shown), such as liner motor, to provide force to move the stage 130 along the pair of magnetic channels 301.

The processing apparatus 160 includes include a support 162 and a processing unit 164. The support 162 includes two risers 161, disposed on the slab 120, supporting three or more bridges 163. The risers 161 and bridges 163 form an opening 166 for the one or more stages 130 to pass under the processing unit 164. The processing unit 164 may be supported by the support 162. In one embodiment, which can be combined with other embodiments described herein, the processing unit 164 is a pattern generator configured to expose a photoresist in a photolithography process. In some embodiments, which can be combined with other embodiments described herein, the pattern generator may be configured to perform a maskless lithography process. Each lithography process corresponds to one or more process recipes of the pattern generator. In some embodiments described herein, idle processes correspond to one or more idle process recipes of the pattern generator. The processing unit 164 includes a plurality of image projection systems 167 disposed in a case 165. Each image projection system of the image projection systems 167 is disposed on adjacent bridges 163. The processing apparatus 160 may be utilized to perform maskless direct patterning. In one embodiment, which can be combined with other embodiments described herein, the processing unit 164 contains as many as 84 image projection systems 167. Each of the image projection systems 167 includes a spatial light modulator. The spatial light modulators include, but are not limited to, microLEDs, OLEDs, digital micromirror devices (DMDs), liquid crystal displays (LCDs), and vertical-cavity surface-emitting lasers (VCSELs). The components of each of the image projection systems 167 vary depending on the spatial light modulator being used.

The controller 190 facilitates the control and automation of the processing techniques described herein. The controller 190 is coupled to or in communication with one or more of the processing apparatus 160, the one or more stages 130, and each encoder 126. The processing apparatus 160 and the one or more stages 130 provide information to the controller regarding the substrate processing and alignment. For example, the processing apparatus 160 provides information to the controller 190 to alert the controller 190 that substrate processing is complete. The controller 190 facilitates the control and automation of methods described herein. A program (or computer instructions), which may be referred to as an imaging program, readable by the controller 190, determines which tasks are performable on the system 100. The program includes a pattern data and code to monitor and control the processing time and substrate position. The pattern data corresponds to an exposure pattern to be written into the photoresist using the electromagnetic radiation.

Figure 2:
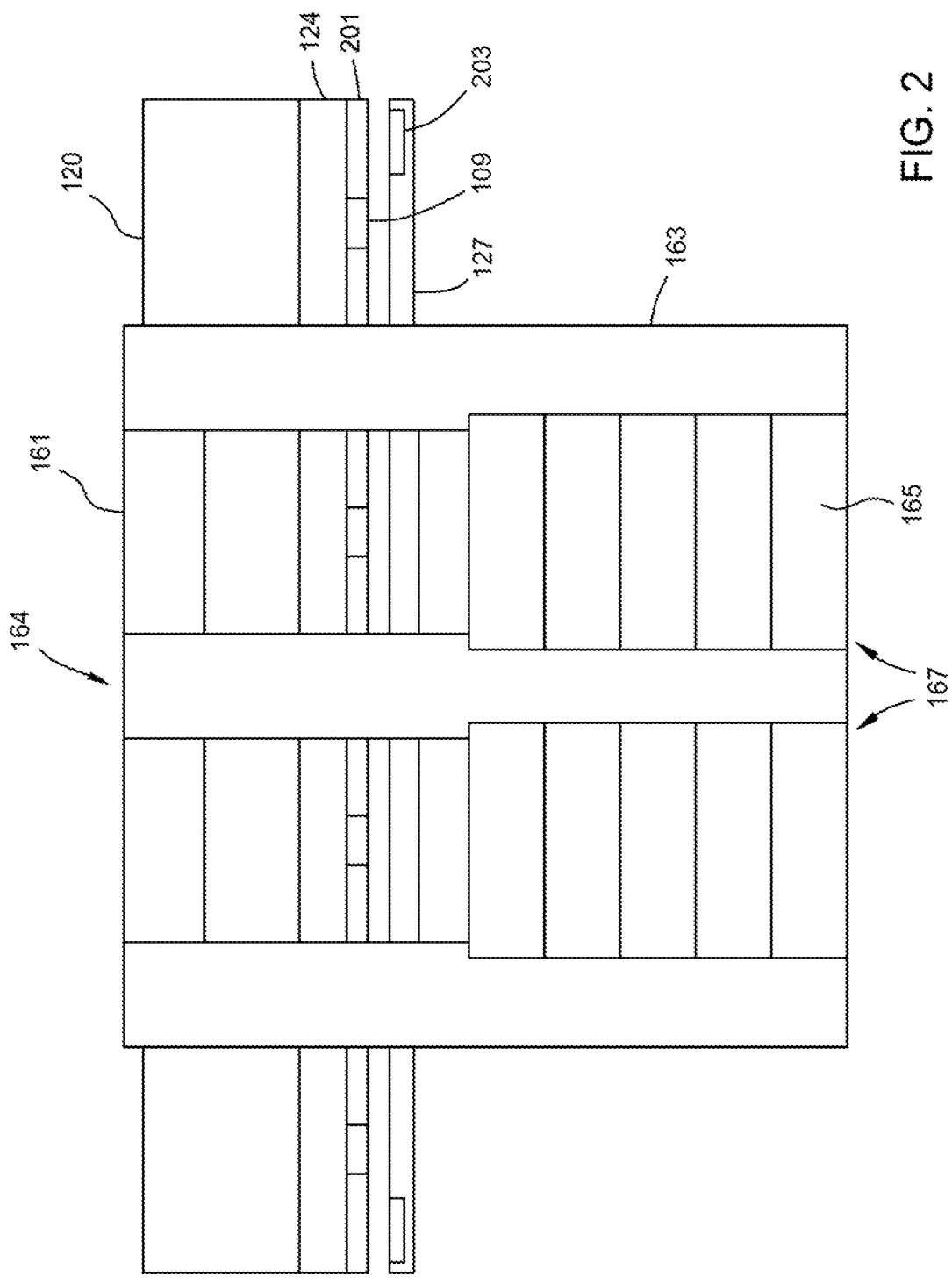
FIG. 2 is a top view of a processing unit of a system according to an embodiment.

During operation, the stage 130 moves in the X-direction from a loading (first) position, as shown in FIG. 1, to a processing (second) position. The processing position is one or more positions of the stage 130 as the stage 130 passes under the processing unit 164. The stage 130 also moves in the Y-direction by moving along a track 150 for processing and/or indexing the substrate 140. The stage 130 is capable of independent operation and can scan a substrate 140 in one direction and step in the other direction. As shown in FIG. 2, a top view of the processing unit 164, in one embodiment, which can be combined with other embodiments described herein, the system 100 includes a preload bar 201, such as a steel preload bar, disposed adjacent to a track of the pair of tracks 124, and one or more encoders 203, such as high resolution encoders, disposed adjacent to the preload bar 201. The controller 190 is further coupled to or in communication with the one or more encoders 127. The one or more encoders 127, during operation, provide locations one the one or more stages 130 in relation to the processing unit 164. To facilitate explanation, FIG. 2 shows and is described with reference to one (first) half of the processing unit 164 and one of the image projection systems 167. However, it is to be noted that, in one embodiment, which can be combined with other embodiments described herein, another (second) half of the processing unit 164 includes another preload bar 201 disposed adjacent to a track of the pair of tracks 124 and one or more additional encoders 203 disposed adjacent to the preload bar 201.

During operation, movements of the stage 130, via the electric motor of the stage 130 providing force to move the stage 130 along the pair of magnetic channels 301, results in the dissipation of heat over a period of time throughout the system 100. Over the period of time, the dissipation of heat throughout the system 100 increases temperatures of components of the system 100, such as the slab 120, the one or more stages 130, the processing apparatus 160, and a substrate 140 supported by each of the one or more stages 130. As temperatures of components of the system 100 increase over the period of time, i.e, the stabilization time, a total pitch 101 of the substrate 140 changes until a stabilization temperature is maintained. At the stabilization temperature, the total pitch 101 is constant. The total pitch 101, also known as a master scale, is defined as a distance 103 between a first point 105 and a second point 107. Operation of the system 100 to perform one or more process recipes during the stabilization time, without the system 100 at the stabilization temperature, may cause subsequent locations of the exposure of the substrate 140 for the process recipes to be distorted and shifted, i.e., result in overlay error. Therefore, one or more idle process recipes are performed until the stabilization temperature. Then, the one or more process recipes are performed. In order to increase throughput, the system, software application, and methods described herein provide at least one of the ability to decrease the stabilization time and write an exposure pattern into a photoresist on a substrate 140 compensating for the change in the total pitch 101 over the stabilization time.

Figure 3:
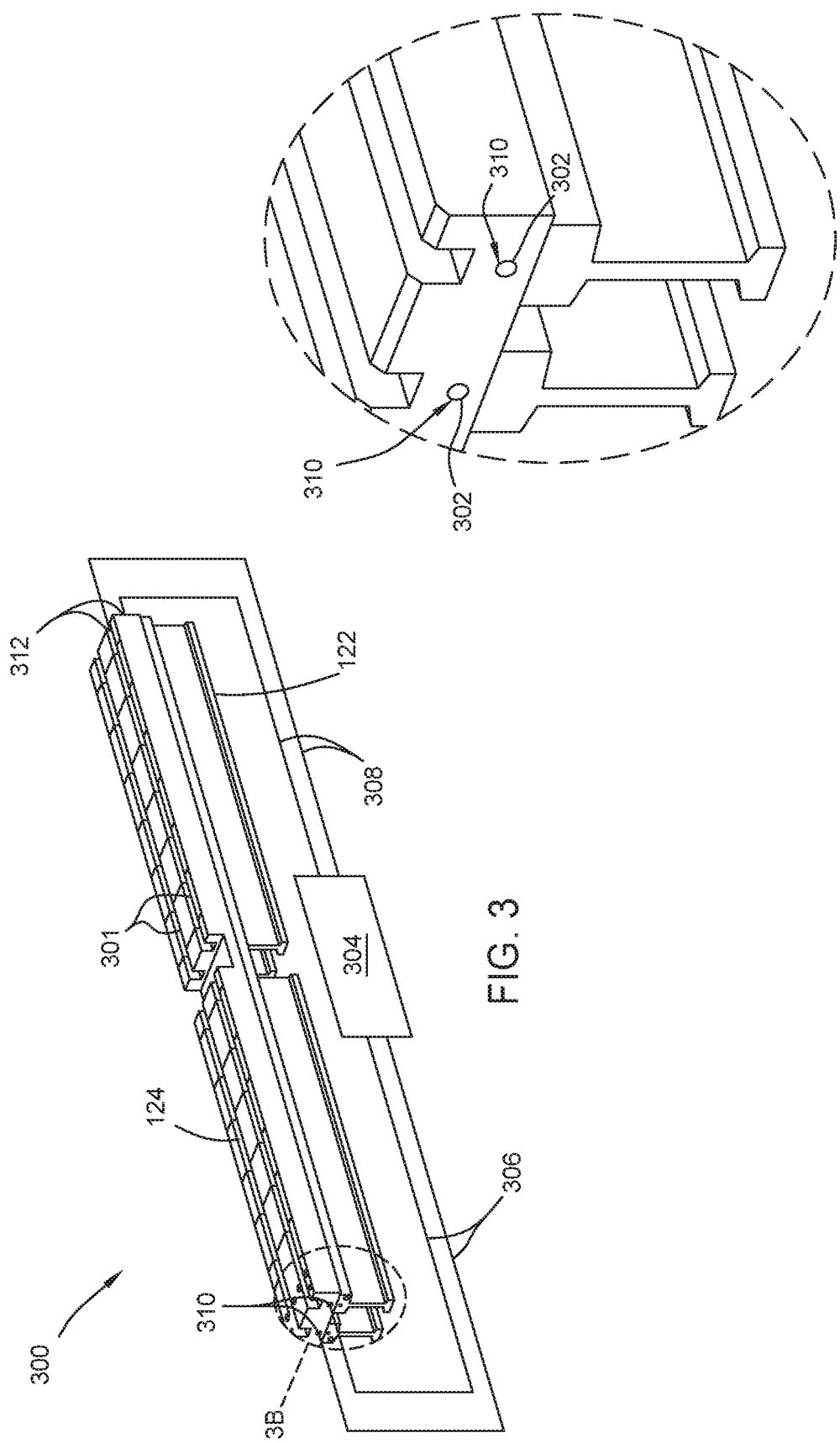
FIG. 3 is a perspective view of a heat exchange system of a system according to an embodiment.

In embodiments described herein, which can be combined with other embodiments described herein, temperature detectors 109, such as resistance temperature detectors (RTDs), are disposed at the pair of tracks 124, the risers 161, the bridges 163, and the slab 120. Temperature detectors 109 are also disposed adjacent to the encoders 126 and the encoders 127. The temperature detectors 109 disposed adjacent to the encoders 127 are disposed on the preload bar 201. The controller 190 is coupled to or in communication with each of the temperature detectors 109. The temperature detectors 109 provide temperature measurements of the pair of tracks 124, the risers 161, the bridges 163, the slab 120, the encoders 126, and encoders 127 to the controller 190. As shown in FIG. 3, a perspective view of a chiller system 300, in one embodiment, which can be combined with other embodiments described herein, the system 100 includes the chiller system 300. The chiller system 300 includes at least one fluid channel 302 coupled to a chiller 304. Each track of the pair of tracks 124 includes the at least one fluid channel 302. To facilitate explanation, FIG. 3 shows and is described with reference to one (first) track of the pair of tracks 124. However, it is to be noted that, in one embodiment, which can be combined with other embodiments described herein, another (second) track of the pair of tracks 124 includes the at least one fluid channel 302.

The chiller 304, such as a chiller, is in fluid communication with each fluid channel 302 via an inlet conduit 306 connected to an inlet 310 of the fluid channel 302 and via an outlet conduit 308 connected to an outlet 312 of the channel 302 such that the pair of tracks 124 is maintained at a predetermined temperature. In one embodiment, which can be combined with other embodiments described herein, each fluid channel 302 has a diameter of about 5 millimeters (mm) to about 20 mm. In another embodiment, which can be combined with other embodiments described herein, the chiller 304 is coupled to an interface box to control a flow rate of a fluid, such as a coolant. The fluid may include a material that can maintain a temperature of about 10° C. to about 30° C. The chiller 304 provides the fluid, which is circulated through each fluid channel 302. The fluid flowing through each fluid channel 302 enables the pair of tracks 124 to be maintained at the predetermined temperature, which assists in controlling the temperature profile of the pair of tracks 124 to control the stabilization temperature and the stabilization time of the system 100. In one embodiment, which can be combined with other embodiments described herein, the fluid is circulated at a flow rate of 2 Liters per minute (L/m) to about 4 L/m.

Figure 4:
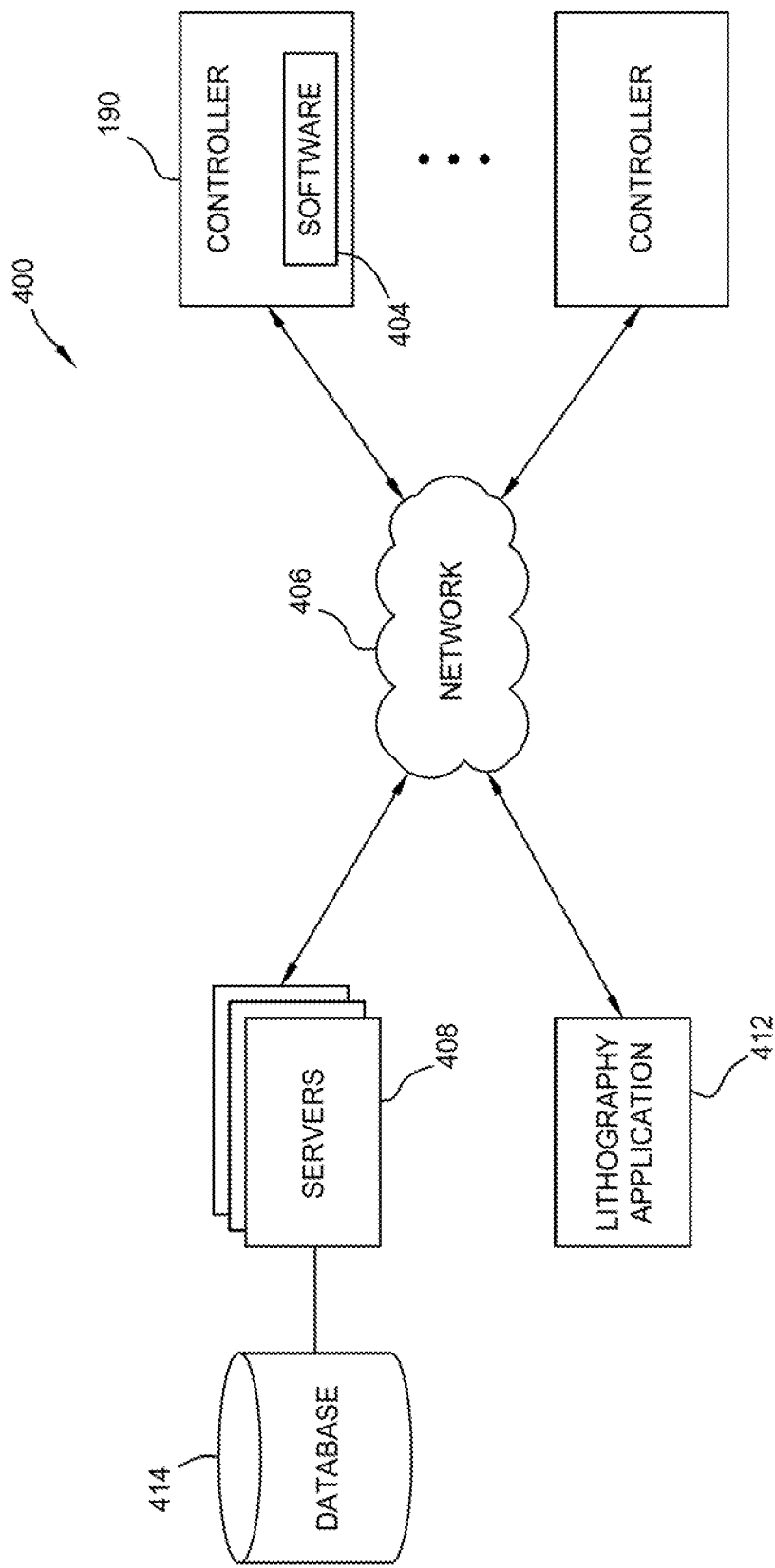
FIG. 4 is a schematic view of a computing system configured for methods of lithography according to an embodiment.

FIG. 4 is a schematic view of a computing system 400 configured for methods of lithography in which embodiments of the disclosure may be practiced. As shown in FIG. 4, the computing system 400 may include a plurality of servers 408, a lithography application 412, and a plurality of controllers (i.e., computers, personal computers, mobile/wireless devices) 190 (only two of which are shown for clarity), each connected to a communications network 406 (for example, the Internet). The servers 408 may communicate with a database 414 via a local connection (for example, a Storage Area Network (SAN) or Network Attached Storage (NAS)) or over the Internet. The servers 408 are configured to either directly access data included in the database 414 or to interface with a database manager that is configured to manage data included within the database 414.

Figure 5:
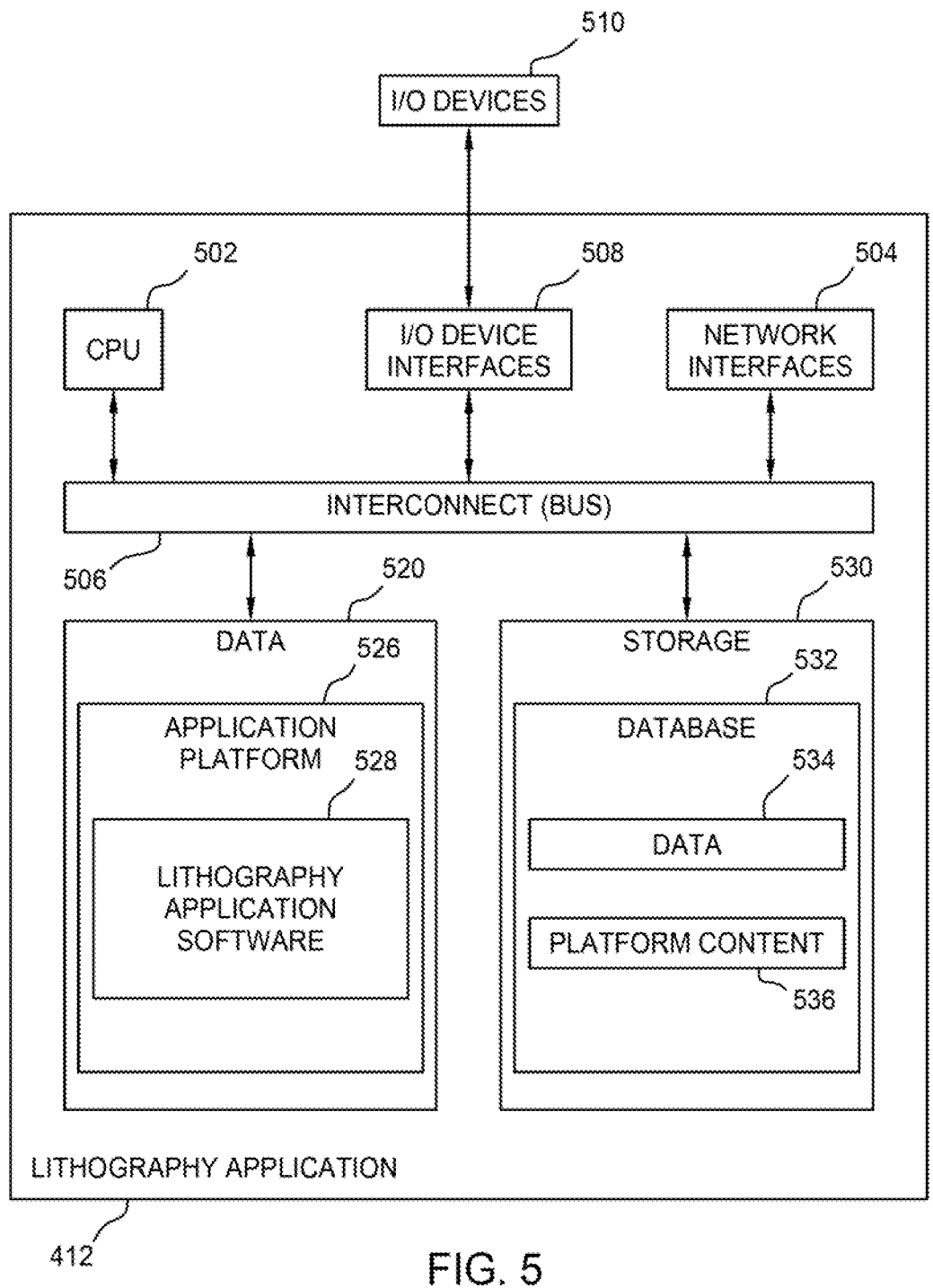
FIG. 5 is a schematic view of the lithography application according to an embodiment.

Each controller 190 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 408 and the lithography application 412 may include a processor and a system memory (not shown), and may be configured to manage content stored in database 414 using, for example, relational database software and/or a file system. The I/O device interfaces 508, as shown in FIG. 5, may be programmed to communicate with one another, the controllers 190, and the lithography application 412 using a network protocol such as, for example, the TCP/IP protocol. The lithography application 412 may communicate directly with the controllers 190 through the communications network 406. The controllers 190 are programmed to execute software 404, such as programs and/or other software applications, and access applications managed by servers 408.

In the embodiments described below, users may respectively operate the controllers 190 that may be connected to the servers 408 over the communications network 406. Pages, images, data, documents, and the like may be displayed to a user via the controllers 190. Information and images may be displayed through a display device and/or a graphical user interface in communication with the controller 190.

It is noted that the controller 190 may be a personal computer, laptop mobile computing device, smart phone, video game console, home digital media player, network-connected television, set top box, and/or other computing devices having components suitable for communicating with the communications network 406 and/or the required applications or software. The controller 190 may also execute other software applications configured to receive content and information from the lithography application 412.

FIG. 5 is a schematic view of the lithography application 412. The lithography application 412 includes, without limitation, a central processing unit (CPU) 502, a network interface 504, memory 520, and storage 530 communicating via an interconnect 506. The lithography application 412 may also include I/O device interfaces 508 connecting I/O devices 510 (for example, keyboard, video, mouse, audio, touchscreen, etc.). The lithography application 412 may further include the network interface 604 (shown in FIG. 6) configured to transmit data via the data communications network.

The CPU 502 retrieves and executes programming instructions stored in the memory 520 and generally controls and coordinates operations of other system components. Similarly, the CPU 502 stores and retrieves application data residing in the memory 520. The CPU 502 is included to be representative of a single CPU, multiple CPU's, a single CPU having multiple processing cores, and the like. The interconnect 506 is used to transmit programming instructions and application data between the CPU 502, I/O device interfaces 508, storage 530, network interfaces 504, and memory 520.

The memory 520 is generally included to be representative of a random access memory and, in operation, stores software applications and data for use by the CPU 502. Although shown as a single unit, the storage 530 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 520 may store instructions and logic for executing an application platform 526 which may include lithography application software 528. The storage 530 may include a database 532 configured to store data 534 and associated application platform content 536. The database 532 may be any type of storage device.

Network computers are another type of computer system that can be used in conjunction with the disclosures provided herein. Network computers do not usually include a hard disk or other mass storage, and the executable programs are loaded from a network connection into the memory 520 for execution by the CPU 602 (shown in FIG. 6). A typical computer system will usually include at least a processor, memory, and an interconnect coupling the memory to the processor.

Figure 6:
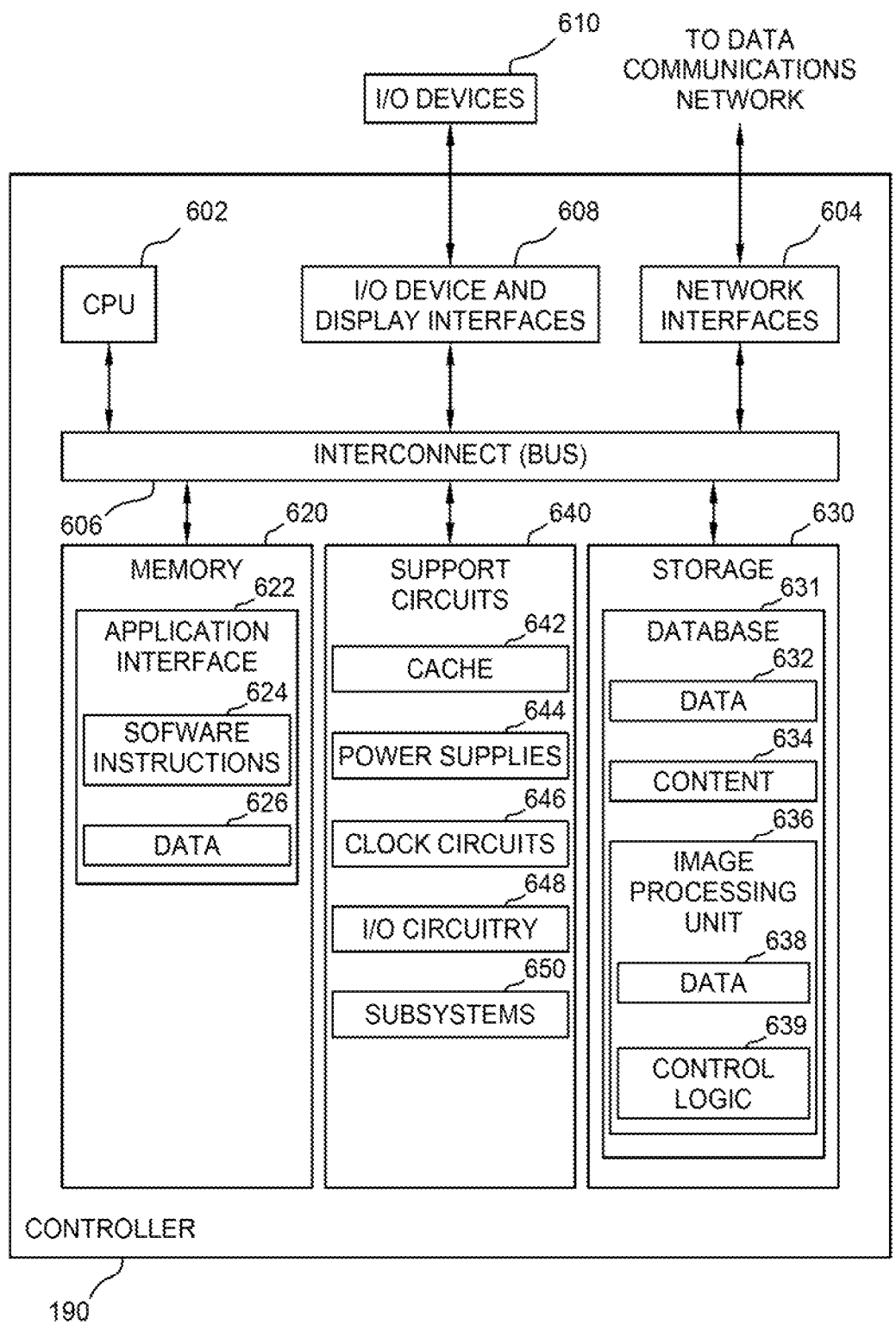
FIG. 6 is a schematic view of a controller according to an embodiment.

FIG. 6 is a schematic view of a controller 190 used to access the lithography application 412 and retrieve or display data associated with the application platform 526. The controller 190 may include, without limitation, a central processing unit (CPU) 602, a network interface 604, an interconnect 606, a memory 620, storage 630, and support circuits 640. The controller 190 may also include an I/O device interface 608 connecting I/O devices 610 (for example, keyboard, display, touchscreen, and mouse devices) to the controller 190.

Like CPU 502, CPU 602 is included to be representative of a single CPU, multiple CPU's, a single CPU having multiple processing cores, etc., and the memory 620 is generally included to be representative of a random access memory. The interconnect 606 may be used to transmit programming instructions and application data between the CPU 602, I/O device interfaces 608, storage 630, network interface 604, and memory 620. The network interface 604 may be configured to transmit data via the communications network 406, for example, to transfer content from the lithography application 412. Storage 630, such as a hard disk drive or solid-state storage drive (SSD), may store non-volatile data. The storage 630 may contain a database 631. The database 631 may contain data 632, other content 634, and an image process unit 636 having data 638 and control logic 639. Illustratively, the memory 620 may include an application interface 622, which itself may display software instructions 624, and/or store or display data 626. The application interface 622 may provide one or more software applications which allow the controller to access data and other content hosted by the lithography application 412.

As shown in FIG. 1, the system 100 includes the controller 190. The controller 190 includes a central processing unit (CPU) 602, memory 620, and support circuits 640 (or I/O 508). The CPU 602 may be one of any form of computer processors that are used in industrial settings for controlling various processes and hardware (e.g., pattern generators, motors, and other hardware) and monitor the processes (e.g., processing time and substrate position). The memory 520, as shown in FIG. 6, is connected to the CPU 602, and may be one or more of a readily available memory, such as random access memory (RAM), read only memory (ROM), floppy disk, hard disk, or any other form of digital storage, local or remote. Software instructions and data can be coded and stored within the memory for instructing the CPU 602. The support circuits 640 are also connected to the CPU 602 for supporting the processor in a conventional manner. The support circuits 640 may include conventional cache 642, power supplies 644, clock circuits 646, input/output circuitry 648, subsystems 650, and the like. A program (or computer instructions) readable by the controller 190 determines which tasks are performable on a substrate 140. The program may be software readable by the controller 190 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the required method operations. The structure for a variety of these systems will appear from the description above. In addition, the present examples are not described with reference to any particular programming language, and various examples may thus be implemented using a variety of programming languages.

As described in greater detail within, embodiments of the disclosure relate to a lithography application relating to at least one of the ability to decrease the stabilization time and write an exposure pattern into a photoresist compensating for the change in the total pitch 101 over the stabilization time. The embodiments described herein relate to a software application platform. The software application platform includes methods of at least one of decreasing the stabilization time and writing an exposure pattern into a photoresist compensating for the change in the total pitch 101 over the stabilization time.

Figure 7A:
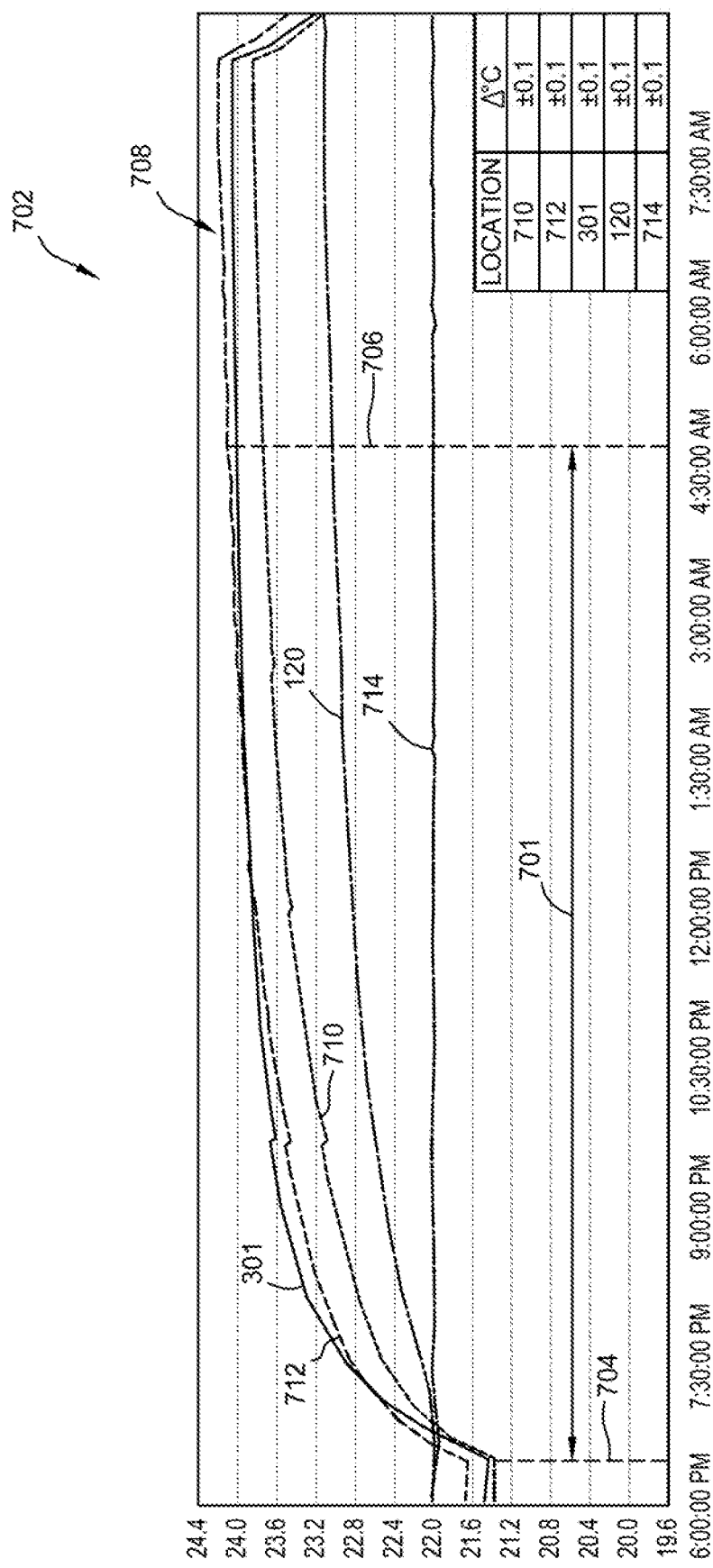
FIGS. 7A-7D are graphs illustrating stabilization time and stabilization temperature of a system according to an embodiment.
Figure 7B:
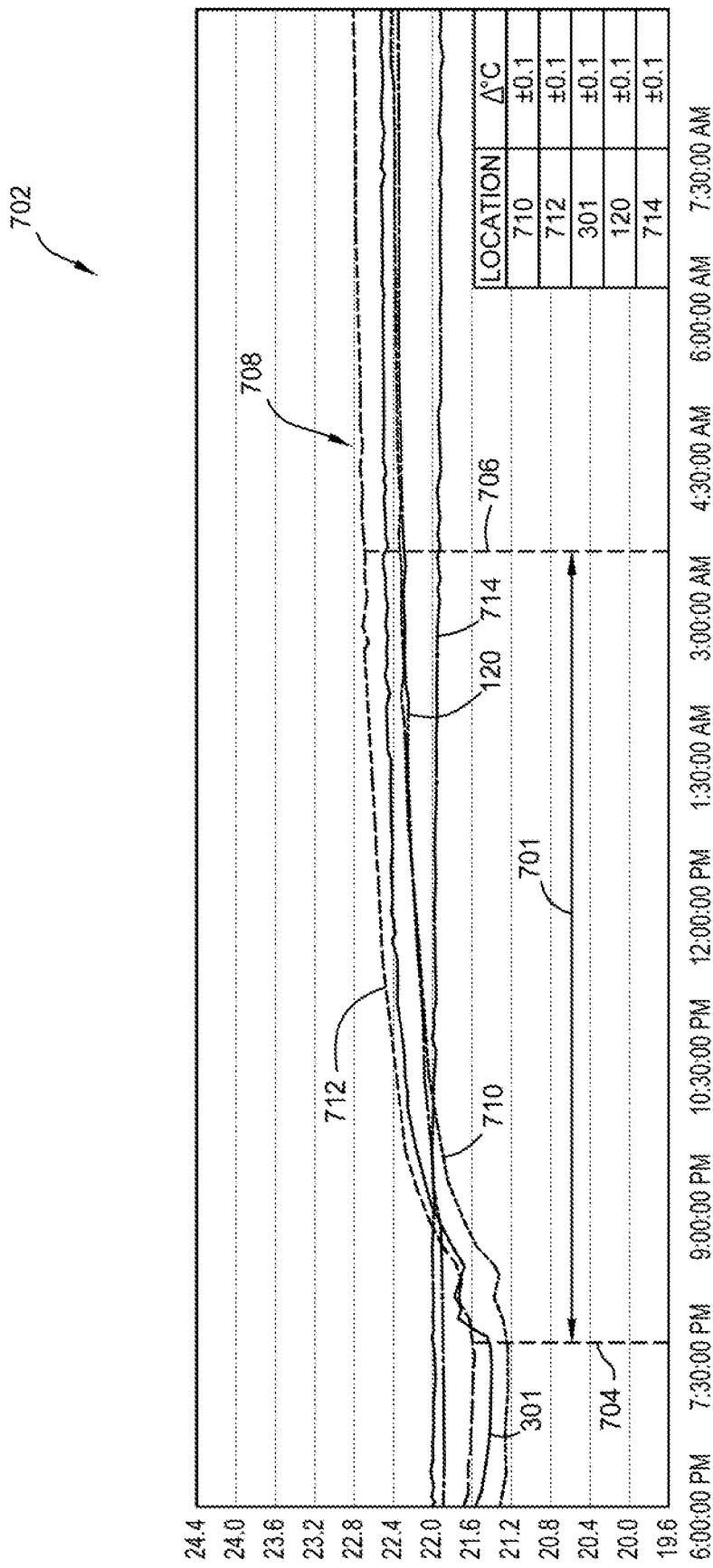

FIG. 7A and FIG. 7B are graphs illustrating stabilization time 701 and stabilization temperature 706 of the system 100 over a period of time 702 without the utilization of the chiller system 300 to maintain the pair of tracks 124 at the predetermined temperature. In one embodiment, as shown in FIG. 7A and FIG. 7B, which can be combined with other embodiments described herein, the heat exchanger maintains the pair of tracks at a system temperature. The system temperature is the same temperature of components of the system 100 during the period of time 702, for example, about 21° C. to about 23° C. FIG. 7A and FIG. 7B, show temperatures of the system 100 measured by the temperature detectors 109 located at a first encoder 710 of the encoders 127, a third encoder 712 of the encoders 127, a magnetic channel 301 of the pair of tracks 124, the slab 120, and a bridge 714 of the bridges 163. In one embodiment, as shown in FIG. 7A and FIG. 7B, which can be combined with other embodiments described herein, over the period of time 702, one or more idle process recipes are performed by the system 100 until the stabilization temperature 706 is reached. In another embodiment, described in further detail herein, over the period of time 702, a first sequence of one or more process recipes are performed by the system 100 to obtain a baseline of the change of the total pitch 101 over the stabilization time for a method 900 of a lithography process. The method 900 provides a compensated pattern data of the pattern data to processing unit 164. The compensated pattern data accounts for changes of the total pitch 101 over the stabilization time such that the exposure pattern of compensated pattern data to be written into the photoresist is devoid of overlay error.

The one or more idle processes have a maximum scan speed for the one or more stages 130. In embodiments, which can be combined with other embodiments described herein, the maximum scan speed is about 100 millimeters per second (mm/s) to about 400 mm/s. The maximum scan speed in FIG. 7A is about 300 mm/s and the maximum scan speed in FIG. 7B is about 200 mm/s. The stabilization time 701 is a duration of time from an initial temperature 704 to the stabilization temperature 706. The stabilization temperature 706 corresponds to a point when temperatures measured by each of the temperature detectors 109 is within −0.1° C. to about 0.1° C., i.e., ±0.1° C., of a final temperature 708 over the period of time 702. The stabilization time 701 in FIG. 7A is about 10.25 hours and the stabilization time 701 in FIG. 7B is about 2.5 hours.

Figure 7C:
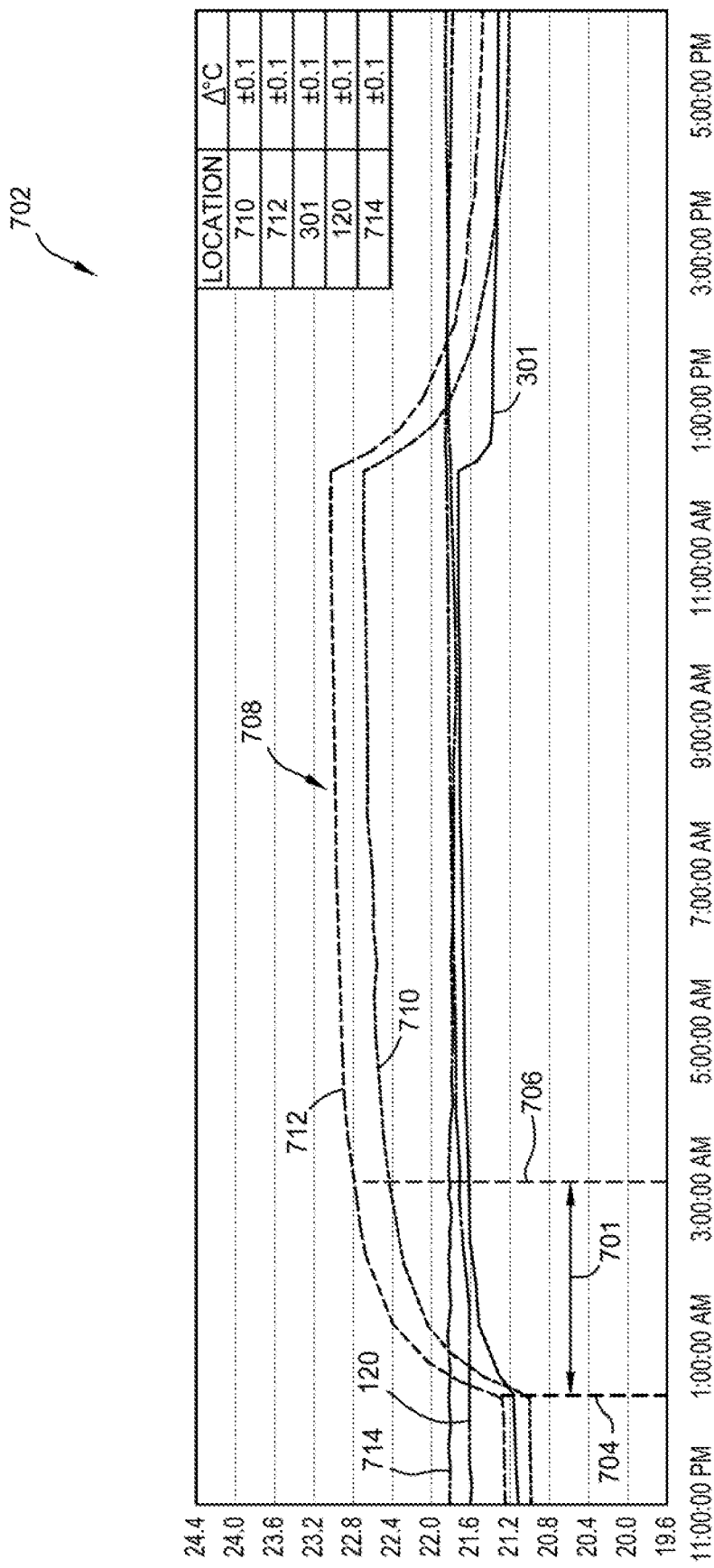
Figure 7D:
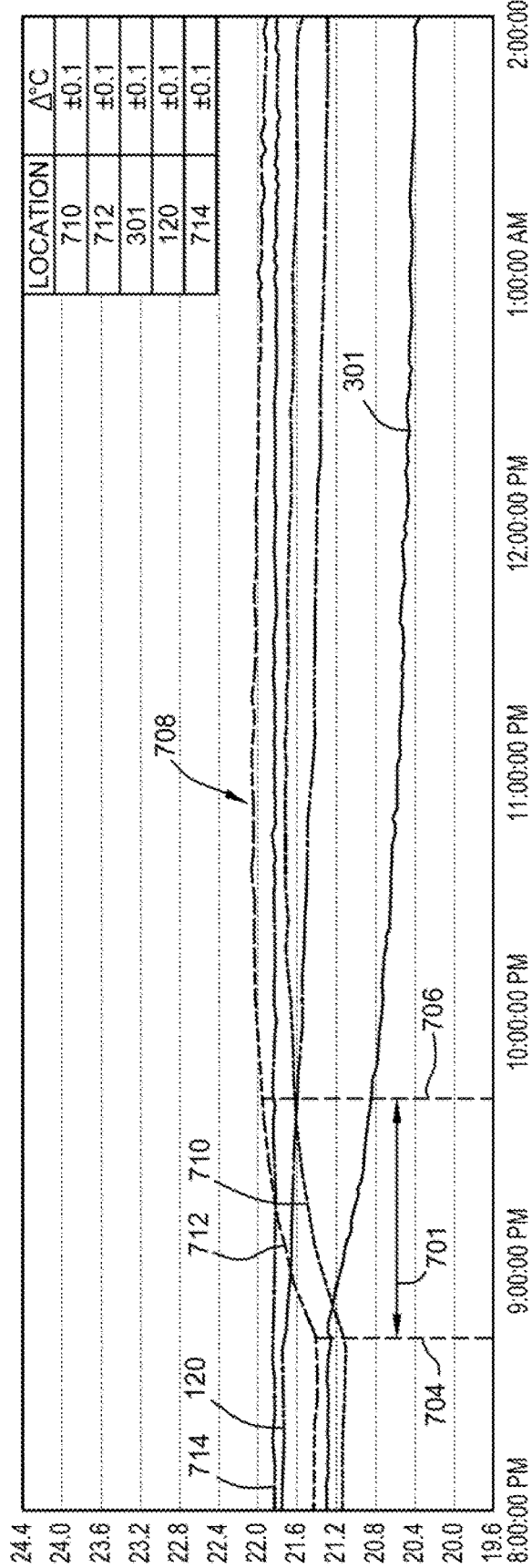
Figure 8:
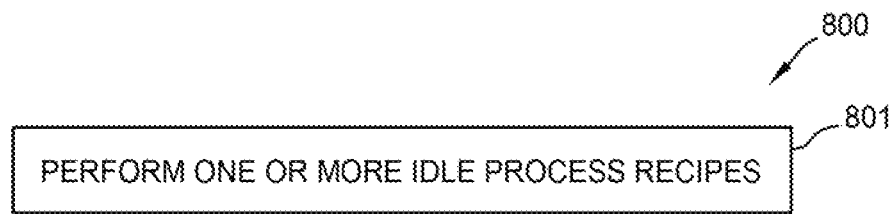
FIG. 8 is a flow diagram of the method of a lithography process according to an embodiment.

FIG. 8 is a flow diagram of the method 800 of a lithography process. The method 800 decreases the stabilization time 701 to increase throughput. FIGS. 7C and 7D are graphs illustrating stabilization time 701 and stabilization temperature 706 of the system 100 over a period of time 702 during the method 800. The method 800 utilizes the chiller system 300 to maintain the pair of tracks 124 at the predetermined temperature. The predetermined temperature is lower than the system temperature. At operation 801, one or more idle process recipes are performed by the system 100. During operation 801, the chiller system 300 maintains the pair of tracks 124 at the predetermined temperature lower than the system temperature. The chiller 304 provides the fluid, which is circulated through each fluid channel 302. In embodiments, which can be combined with other embodiments described herein, the predetermined temperature is about 10° C. to about 21° C. The stabilization time 701 in FIG. 7C, with a maximum scan speed of about 300 mm/s, is about 2.5 hours and the stabilization time 701 in FIG. 7D, with a maximum scan speed of about 200 mm/s, is about 1 hour. In one embodiment, which can be combined with other embodiments described herein, the method 800 provides reduces the stabilization time 701 by about 70% to about 90%. After the method 800, sequences of one or more process recipes may be performed.

Figure 9:
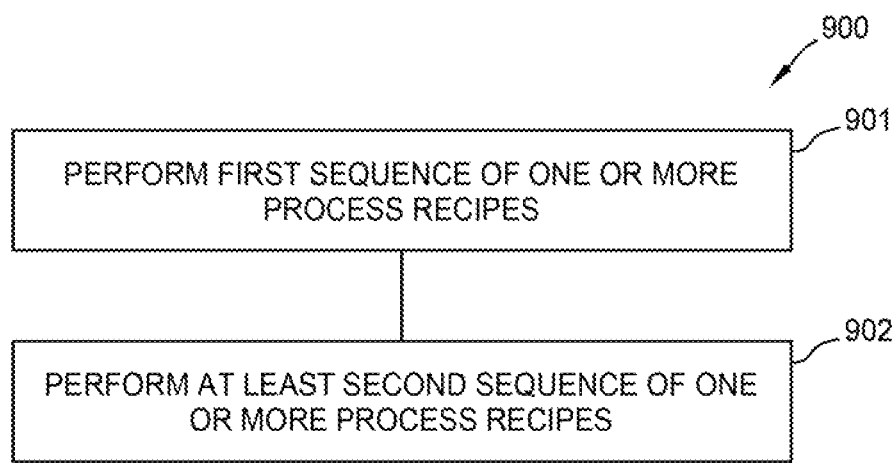
FIG. 9 is a flow diagram of the method of a lithography process according to an embodiment.

FIG. 9 is a flow diagram of the method 900 of a lithography process. The method 900 provides the ability to write the exposure pattern into the photoresist on the substrate 140 compensating for the change in the total pitch 101 over the stabilization time 701. Therefore, sequences of one or more process recipes may be performed without performing one or more idle process recipes to reach the stabilization temperature 706. At operation 901, a first sequence of one or more process recipes is performed by the system 100. The first sequence of one or more process recipes obtains a baseline of the change of the total pitch 101 over the stabilization time 701. In the first sequence of one or more process recipes, the processing unit 164 receives pattern data from the controller 190 and exposes the photoresist to an exposure pattern corresponding to the mask pattern data. In one embodiment, which can be combined with other embodiments described herein, during operation 901, the chiller system 300 maintains the pair of tracks 124 at the predetermined temperature. After operation 901, the total pitch 101 of a first substrate and an overlay error of the exposure pattern written of the exposure pattern is measured. In one embodiment, which can be combined with other embodiments described herein, an inspection system measures and provides the total pitch 101 and the overlay error to the controller 190. The controller 190 receives the total pitch 101 and overlay error and provides a compensated pattern data to the processing unit 164. In another embodiment, which can be combined with other embodiments described herein, the temperatures of the system 100 measured by the temperature detectors 109 over the period of time 702 are collected by the controller 190 and the controller 190 generates a compensated pattern data based on the temperatures. At operation 902, at least a second sequence of one or more process recipes is performed by the system 100. In the second sequence of one or more process recipes, the processing unit 164 receives the compensated pattern data from the controller 190 and exposes the photoresist to a compensated exposure pattern corresponding to the compensated pattern data. The compensated pattern data accounts for changes of the total pitch 101 over the stabilization time such that the compensated exposure pattern to be written into the photoresist of a second substrate is devoid of overlay error. In one embodiment, which can be combined with other embodiments described herein, during operation 902, the chiller system 300 maintains the pair of tracks 124 at the predetermined temperature.

In summation, a system, a software application, and methods of a lithography process that provide at least one of the ability to decrease the stabilization time and write an exposure pattern into a photoresist on a substrate compensating for the change in the total pitch over a stabilization time. The utilization of the heat exchange maintains the pair of tracks at a predetermined temperature which assists in controlling the temperature profile of the pair of tracks to control the stabilization temperature and reduce the stabilization time of the system. The utilization of the temperature detectors provides generation of a compensated pattern data based on temperatures of the system over the period of time corresponding to a first sequence of one or more process recipes. Therefore, at least one second sequence of one or more process recipes may be performed by the system with a compensated exposure pattern that accounts for changes of the total pitch over the stabilization time.

While the foregoing is directed to examples of the present disclosure, other and further examples of the disclosure may be devised without departing from the basic scope thereof, and the scope thereof is determined by the claims that follow.

What is claimed is:

1. A system, comprising:
   a slab;
   a stage disposed over the slab, the stage configured to support a substrate and having an electric motor operable to move the stage along a pair of tracks;
   a pair of supports disposed on and coupled to the slab, the pair of supports supporting and coupled to the pair of tracks, each of the tracks having:
      at least one fluid channel disposed therein, each fluid channel has an inlet and outlet to be connected to a chiller of a chiller system coupled to a controller; and
   a processing apparatus, the processing apparatus having:
      an apparatus support coupled to the slab, the apparatus support having an opening for the stage to pass thereunder; and
      a processing unit supported by the apparatus support, the processing unit having a plurality of image projection systems, the processing unit coupled to the controller configured to provide a first pattern data and a second pattern data to the processing unit, wherein:
         the controller is operable to control a flow rate and a predetermined temperature of a fluid circulated through each fluid channel and provide the first pattern data of one or more idle recipes until the system is maintained at a stabilization temperature; and
         the controller is operable to provide the second pattern data of one or more process recipes once the system is maintained at the stabilization temperature.

2. The system of claim 1, further comprising one or more temperature detectors located at one or more of the slab, the apparatus support, and at least one track of the pair of tracks.

3. A system, comprising:
   a slab;
   a stage disposed over the slab, the stage configured to support a substrate and having an electric motor operable to move the stage along a pair of tracks;
   a pair of supports disposed on and coupled to the slab, the pair of supports supporting and coupled to the pair of tracks, each of the tracks having:
      at least one fluid channel disposed therein, each fluid channel has an inlet and outlet to be connected to a chiller of a chiller system coupled to a controller, and wherein the controller is configured to control a flow rate and a predetermined temperature of a fluid circulated through each fluid channel to maintain the system at a stabilization temperature;
   a processing apparatus, the processing apparatus having
      an apparatus support coupled to the slab, the apparatus support having an opening for the stage to pass thereunder; and
      a processing unit supported by the apparatus support, the processing unit having a plurality of image projection systems, the processing unit coupled to the controller configured to provide a pattern data to processing unit; and one or more temperature detectors located at one or more of the slab, the apparatus support, and at least one track of the pair of tracks, wherein:
  the pattern data received by processing unit corresponds to a sequence of one or more process recipes in which each of the image projection systems expose a photoresist disposed on the substrate to an exposure pattern;
  the temperature detectors are coupled to the controller, and the temperature detectors are configured to provide measured temperatures during the exposure of the photoresist to the controller; and
  based on the measured temperatures, the controller is configured to generate a compensated pattern data and provide the compensated pattern data to the processing unit.

4. The system of claim 3, wherein the apparatus support comprises:
  two risers disposed on the slab;
  three or more bridges supported by the risers, wherein the risers and bridges form the opening for the stage to pass thereunder and each image projection system is disposed on adjacent bridges; and
  the one or more temperature detectors, coupled to the controller, are located at the risers and the bridges.

5. The system of claim 4, wherein:
  the pair of tracks is a pair of magnetic channels and the stage includes an electric motor to provide force to move the stage along the pair of magnetic channels; and
  the one or more temperature detectors, coupled to the controller, are located adjacent to one or more encoders disposed adjacent to at least one magnetic channel of the pair of magnetic channels.

6. The system of claim 5, wherein the encoders are configured to provide locations of the stage in relation to the processing unit.

7. The system of claim 2, wherein the temperature detectors are resistance temperature detectors (RTDs).

8. The system of claim 1, wherein the image projection systems comprise spatial light modulators, the spatial light modulators selected from the group consisting of microLEDs, OLEDs, digital micromirror devices (DMDs), liquid crystal displays (LCDs), and vertical-cavity surface-emitting lasers (VCSELs).

9. A system, comprising:
  a slab;
  a moveable stage disposed over the slab, the stage configured to support a substrate;
  a pair of supports disposed on the slab, the pair of supports supporting a pair of tracks, and the stage is configured to move along the pair of tracks;
  a processing apparatus, the processing apparatus having
    an apparatus support coupled to the slab, the apparatus support having an opening for the stage to pass thereunder; and
    a processing unit supported by the apparatus support, the processing unit having a plurality of image projection systems, the processing unit coupled to a controller configured to provide a pattern data to the processing unit; and
  one or more temperature detectors located at one or more of the slab, the apparatus support, and at least one track of the pair of tracks, wherein:
  the pattern data received by processing unit corresponds to a sequence of one or more process recipes in which each of the image projection systems expose a photoresist disposed on the substrate to an exposure pattern;
  the temperature detectors are coupled to the controller, and the temperature detectors are configured to provide measured temperatures during exposure of the photoresist to the controller; and
  based on the measured temperatures, the controller is configured to generate a compensated pattern data and provide the compensated pattern data to the processing unit.

10. The system of claim 9, wherein the apparatus support comprises:
  two risers disposed on the slab;
  three or more bridges supported by the risers, wherein the risers and bridges form the opening for the stage to pass thereunder and each image projection system is disposed on adjacent bridges; and
  the one or more temperature detectors, coupled to the controller, are located at the risers and the bridges.

11. The system of claim 10, wherein:
  the pair of tracks is a pair of magnetic channels and the stage includes an electric motor to provide force to move the stage along the pair of magnetic channels; and
  the one or more temperature detectors, coupled to the controller, are located adjacent to one or more encoders disposed adjacent to at least one magnetic channel of the pair of magnetic channels.

12. The system of claim 11, wherein the encoders are configured to provide locations the stage in relation to the processing unit.

13. The system of claim 9, further comprising a chiller system, the chiller system having:
  at least one fluid channel disposed in each track of the pair of tracks;
  each fluid channel having an inlet and outlet to be connected to a chiller, the chiller is coupled to the controller; and
  wherein the controller is configured to control a flow rate and a predetermined temperature of a fluid circulated through each fluid channel.

14. The system of claim 9, wherein the temperature detectors are resistance temperature detectors (RTDs).

15. The system of claim 9, wherein the image projection systems comprise spatial light modulators, the spatial light modulators are selected from the group consisting of microLEDs, OLEDs, digital micromirror devices (DMDs), liquid crystal displays (LCDs), and vertical-cavity surface-emitting lasers (VCSELs).

16. A system, comprising:
  a slab;
  a moveable stage disposed over the slab, the stage configured to support a substrate;
  a pair of supports disposed on the slab, the pair of supports supporting a pair of tracks, and the stage is configured to move along the pair of tracks;
  a processing apparatus, the processing apparatus having
    an apparatus support coupled to the slab, the apparatus support having an opening for the stage to pass thereunder; and
    a processing unit supported by the apparatus support, the processing unit having a plurality of image projection systems, the processing unit coupled to a controller configured to provide a pattern data to the processing unit;

a chiller system, the chiller system having at least one fluid channel disposed in each track of the pair of tracks; and one or more temperature detectors located at one or more of the slab, the apparatus support, and at least one track of the pair of tracks, wherein:

the pattern data received by processing unit corresponds to a sequence of one or more process recipes in which each of the image projection systems expose a photoresist disposed on the substrate to an exposure pattern;

the temperature detectors are coupled to the controller, and the temperature detectors are configured to provide measured temperatures during exposure of the photoresist to the controller; and based on the measured temperatures, the controller is configured to generate a compensated pattern data and provide the compensated pattern data to the processing unit.

17. The system of claim 16, wherein each fluid channel has an inlet and outlet to be connected to a chiller coupled to the controller, and wherein the controller is configured to control a flow rate and a predetermined temperature of a fluid circulated through each fluid channel.

18. The system of claim 17, wherein:

the pair of tracks is a pair of magnetic channels and the stage includes an electric motor to provide force to move the stage along the pair of magnetic channels; and the one or more temperature detectors, coupled to the controller, are located adjacent to one or more encoders disposed adjacent to at least one magnetic channel of the pair of magnetic channels.

* * * * *